United States Patent [19]
Song et al.

[11] Patent Number: 5,457,416
[45] Date of Patent: Oct. 10, 1995

[54] ELECTROOPTIC Q-SWITCHING DRIVE CIRCUIT FOR PORRO PRISM LASER RESONATOR

[75] Inventors: In Seob Song; Young Soo Choi; Yong Chan Park; Eung Cheol Kang, all of Daejon, Rep. of Korea

[73] Assignee: Agency for Defense Development, Daejon, Rep. of Korea

[21] Appl. No.: 142,202

[22] Filed: Oct. 25, 1993

[30] Foreign Application Priority Data

Jul. 24, 1993 [KR] Rep. of Korea .................. 14133/1993

[51] Int. Cl.$^6$ .................................................. H03K 3/352
[52] U.S. Cl. ........................ 327/190; 327/270; 327/438
[58] Field of Search ............................. 307/282, 630, 307/314, 270; 327/190, 438, 270, 443, 304

[56] References Cited

U.S. PATENT DOCUMENTS

| | | | |
|---|---|---|---|
| 2,838,686 | 6/1958 | Eckert, Jr. ................................ | 307/314 |
| 3,313,957 | 4/1967 | Fischman ............................... | 307/282 |
| 3,868,683 | 2/1975 | Darrow .................................. | 307/630 |
| 4,052,623 | 10/1977 | Loberg .................................. | 307/282 |
| 4,339,671 | 7/1982 | Park et al. .............................. | 307/314 |
| 4,401,902 | 8/1983 | Onodera et al. ....................... | 307/314 |

OTHER PUBLICATIONS

M. K. Chun et al., "Laser: an electrooptically Q-switched Porro prism device", *Applied Optics*, vol. 15 (No. 8), 1942 (1976).

Sandra Giacomini et al., "Fast optical switching in a high power Nd:YAG", *Applied Optics*, vol. 26 (No. 16), 3179 (1987).

Robert Goldstein, "Electro-Optic Devices in Review", *Lasers & Applications*, vol. 5 (No. 4), pp. 67–73 (Apr., 1986).

J. T. Lin et al., "Choosing A Nonlinear Crystal", *Lasers & Optronics*, vol. 6 (No. 11), p. 59–63 (Nov., 1987).

Walter Koechner, "Solid–State Laser Engineering", 2nd Edition, *Springer–Verlag*, pp. 414–431 (1988).

Primary Examiner—John S. Heyman
Assistant Examiner—My-Trang Nu Ton
Attorney, Agent, or Firm—Darby & Darby

[57] ABSTRACT

A Q-switching drive circuit utilizing a magnetization curve characteristic of a saturation reactor, thereby capable of achieving a semipermanent use life, a rapid switching into a Q-switching opening phase voltage, a maintenance of the Q-switching opening phase voltage for a period of several hundreds nanoseconds. The Q-switching drive circuit can operate at a high repeat rate. An initial closing phase-delayed voltage is maintained in the Q-switching drive circuit so that a prelasing phenomenon is prevented from occurring upon oscillating the laser. The Q-switching drive circuit utilizes a magnetization curve characteristic of the saturation reactor so that a characteristic of a rapid return of the phase voltage from the opening state to the closing state can be obtained.

8 Claims, 2 Drawing Sheets

ELECTROOPTIC Q-SWITCHING DRIVE CIRCUIT FOR PORRO PRISM LASER RESONATOR

BACKGROUND OF THE INVENTION

1. Field of the Invention

The present invention relates to an electrooptic Q-switching drive circuit for a porro prism laser resonator, and more particularly to an electrooptic Q-switching drive circuit utilizing a magnetization curve characteristic of a saturation reactor.

2. Description of the Prior Art

In general, in electrooptic Q-switching drive circuits, short phase-delayed high voltage pulses are generated by use of vacuum tubes, cold cathode gas tubes, hydrogen dynatrons, transistors or semiconductor switches. In these circuits, however, there are drawbacks of a relatively short use life, a slow operation speed, and an occurrence of a prelasing phenomenon.

SUMMARY OF THE INVENTION

Therefore, an object of the invention is to eliminate drawbacks encountered in the prior art and to provide an electrooptic Q-switching drive circuit for a porro prism laser resonator capable of achieving a lengthy use life and a high operation speed and being free of a prelasing phenomenon.

In accordance with the present invention, this object is accomplished by providing a Q-switching drive circuit for a porro prism laser resonator comprising: an opening voltage adjusting circuit adapted to adjust an opening voltage applied to a primary coil of a transformer; a first capacitor adapted to store a voltage predetermined by said opening voltage adjusting circuit and feed it to said primary coil of the transformer, said first capacitor having a capacitance enabling a utilization of the transformer up to a saturated range with respect to the primary coil of the transformer; a transformer drive controlling circuit adapted to control driving of the transformer, said transformer drive controlling circuit including a thyristor; a diode adapted to prevent said thyristor from being damaged due to a counter electromotive force generated from the transformer; a resistor adapted to adjust an impedance of a secondary coil of the transformer and thereby sufficiently reflect a variation in voltage occurring at a Docket cell terminal; a second capacitor adapted to shut off a closing voltage to be fed to said secondary coil of the transformer; and a closing voltage adjusting circuit adapted to adjust said closing voltage to be stored in said second capacitor.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
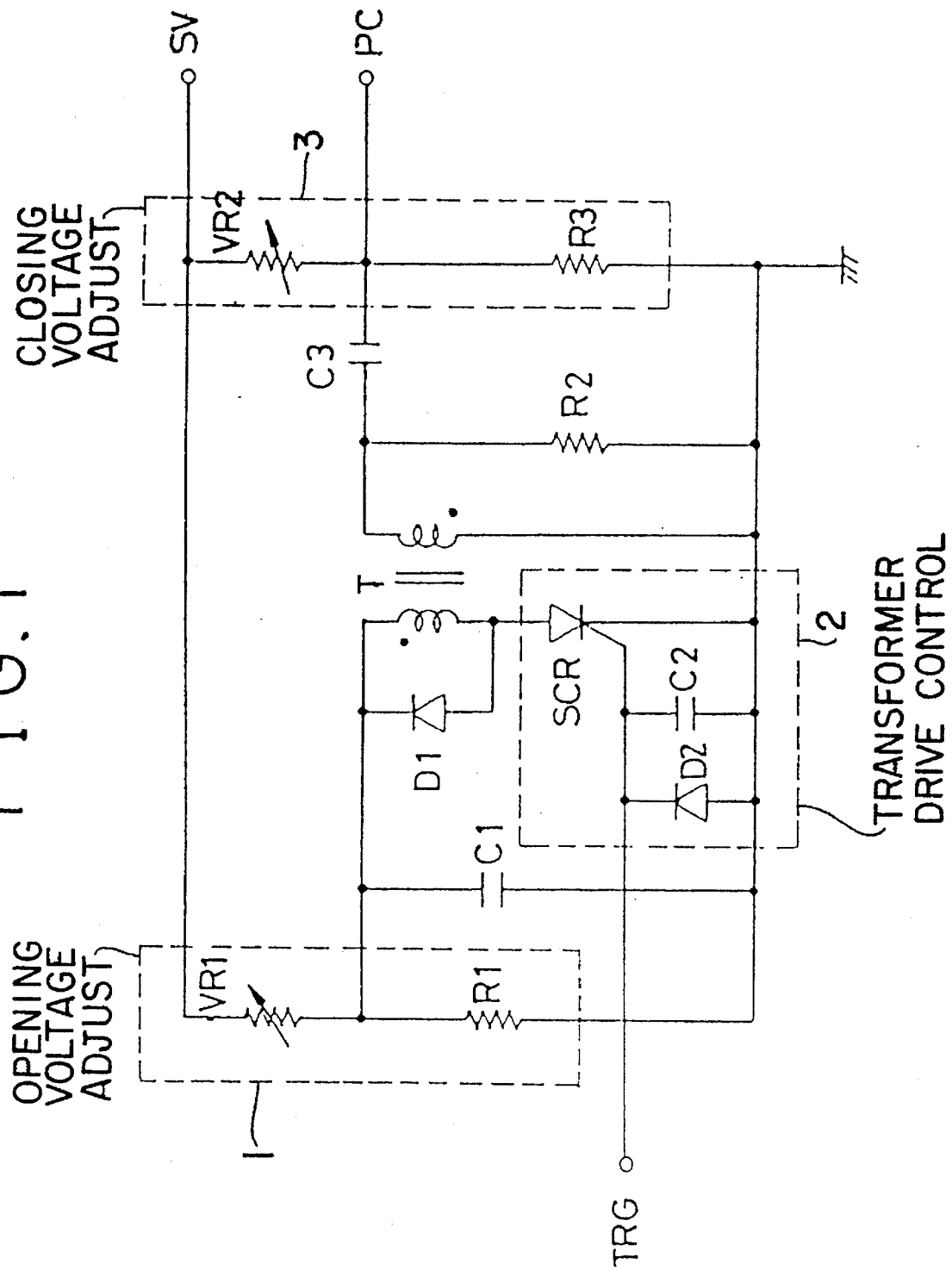
FIG. 1 is a circuit diagram of an electrooptic Q-switching drive circuit for a porro prism laser in accordance with the present invention.

FIG. 1 is a circuit diagram of an electrooptic Q-switching drive circuit for a porro prism laser in accordance with the present invention.

As shown in FIG. 1, the Q-switching drive circuit includes an opening voltage adjusting circuit 1 adapted to adjust an opening voltage applied to a primary coil of a transformer T connected thereto. The opening voltage adjusting circuit 1 includes a variable resistor VR1 and a resistor R1 connected to a voltage source terminal SV in series. A capacitor C1 is connected to the junction between the variable resistor VR1 and the resistor R1. The capacitor C1 also has one terminal coupled to the primary coil of the transformer T and the other terminal thereof coupled to ground. The capacitor C1 serves to store a voltage predetermined by the opening voltage adjusting circuit 1 and feed it to the primary coil of the transformer T. The capacitor C1 has a capacitance enabling a utilization of the transformer T up to a saturated range with respect to the primary coil of the transformer T.

For controlling driving of the transformer T, a transformer drive controlling circuit 2 is provided which includes a thyristor SCR, a diode D1, a diode D2 and a capacitor C2. The diode D1 is connected to the primary coil of the transformer T in parallel and the thyristor SCR in series between one transformer terminal and ground. The diode D1 serves to prevent the thyristor SCR from being damaged due to a courtlier electromotive force generated by transformer T. The diode D2 and the capacitor C2 are connected in parallel and coupled to a gate of the thyristor SCR, A resistor R2 is connected in parallel to a secondary cell of the transformer T to adjust an impedance of the secondary coil of the transformer T and thus sufficiently reflect a variation in voltage occurring at a pocket cell terminal PC coupled with the secondary coil. A capacitor C3 is coupled between the output of the secondary coil of the transformer T and the pocket cell terminal PC. The capacitor C3 serves to shut off a closing voltage to be fed to the secondary coil of the transformer T. The Q-switching drive circuit further includes a closing voltage adjusting circuit 3 including a variable resistor VR2 and a resistor R3 connected in series between the voltage source terminal SV and ground. The capacitor C3 is connected to the junction between the variable resistor VR2 and the resistor R3. The closing voltage adjusting circuit 3 is adapted to adjust the closing voltage to be stored in the capacitor C3.

Function and effect of the Q-switching drive circuit having the above-mentioned arrangement will now be described, in conjunction with FIGS. 2 and 3.

The variable resistor VR1 and resistor R1 of the opening voltage adjusting circuit 1 adjust an opening voltage which is charged in the capacitor C1. When the thyristor SCR is turned on by a trigger signal TRG externally inputted thereto, the opening voltage from the capacitor C1 is discharged through the primary coil of the transformer T. As a result, a voltage appears across the secondary coil of the transformer T.

Figure 2:
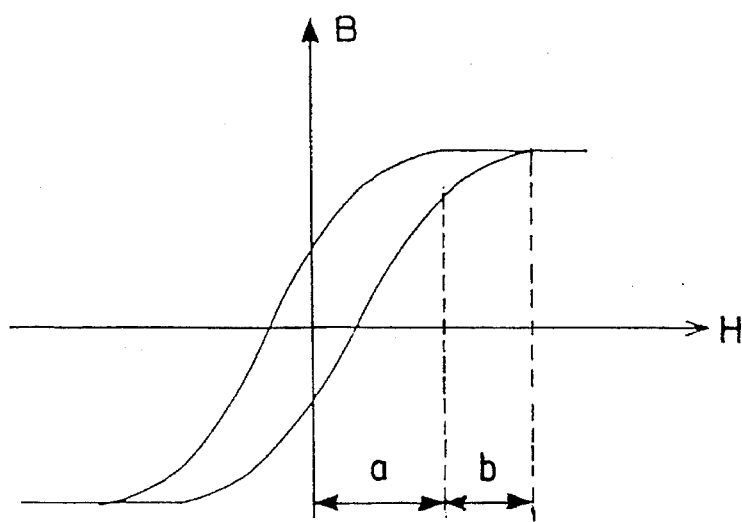
FIG. 2 is a magnetization curve of a transformer core which is employed in accordance with the present invention.
Figure 3:
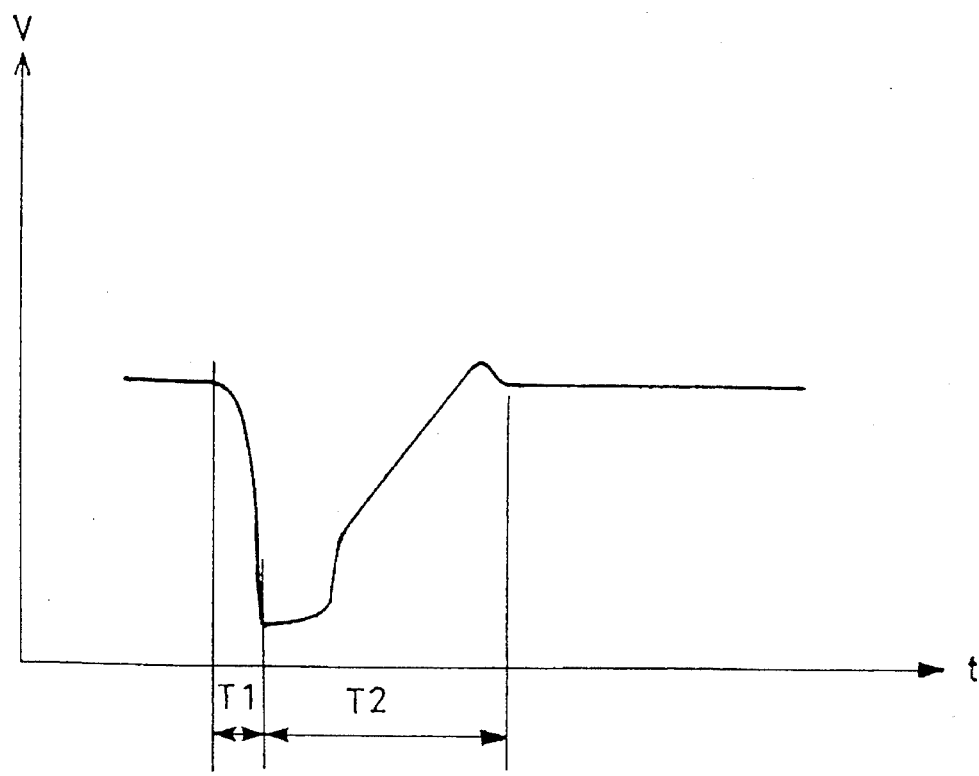
FIG. 3 is a diagram illustrating a waveform of a phase-delayed voltage generated at a pocket cell terminal equipped in the Q-switching drive circuit of FIG. 1.

Generally, a transformer core involves a magnetization curve which includes a linear range and a saturated range which are denoted as A and B in FIG. 2. When such a transformer core is employed for purposes in boosting or dropping a voltage, that is, purpose in varying input and output voltages depending on a turns ratio of the transformer coils, the linear range A is only utilized. The saturated range B is primarily a function of transformer core characteristics.

The Q-switching drive circuit of the present invention utilizes the saturated range B as well as the linear range A so as to achieve a rapid voltage variation and a maintenance of the varied voltage for a predetermined period. To this end, the capacitance of the capacitor C1 and the inductance at the primary coil of the transformer T should be appropriately predetermined. When such a requirement is satisfied, the magnetization curve of FIG. 2 can be obtained. In the operation of the circuit of the present invention, the Q-switching takes place soon, typically about 120 μs, after a flash lamp is triggered. That is, in FIG. 1, while maintaining a closed voltage by circuit 3 which is determined by the variable resistor $VR_2$ and resistor $R_3$, a trigger signal TRG is generated after, typically about 120 μs, the flash lamp is triggered so that the thyristor SCR is opened. Then the voltage charged at the capacitor $C_1$, as set by opening voltage adjusting circuit, is supplied to the transformer T so that an opening voltage is generated. After the voltage supplied to the transformer T from capacitor $C_1$ is completely discharged, a voltage determined by the variable resistor $VR_2$ and resistor $R_3$ is supplied again to the pocket cell PC, thereby maintaining a closed voltage.

The transformer T can be saturated by remnant electrical energy other than energy transferred to its secondary coil. This makes it possible to reduce a time taken in increasing the voltage and to maintain a varied voltage for a predetermined period even after the variation in voltage.

The diode D1 which is connected to the primary coil of the transformer T serves to prevent a damage of a pocket cell connected to the pocket cell terminal PC due to a counter electromagnetic force from the transformer T.

The diode D2 and capacitor C2 connected to the gate of the thyristor SCR serves to not only protect the gate terminal of the thyristor SCR, but also remove a noise.

As the thyristor SCR is turned on, a phase-delayed voltage appears at the pocket cell terminal PC by the saturation reactance of the transformer T. Such a phase-delayed voltage is shown in FIG. 3. As shown in FIG. 3, the phase-delayed voltage is maintained as a closing voltage for a predetermined period and then converted into an opening voltage for reducing a loss of voltage when a trigger signal TRG is received. A pulse variation time of the opening voltage for the phase delay is about 100ns, as shown by interval T1 of FIG. 3. The opening voltage is kept for a period of 500ns according to a characteristic of the saturation curve thereof.

On the other hand, at an interval T2 where the voltage is varied into the closing voltage, the counter electromagnetic force occurring due to a decrease in magnetic flux density is discharged through the diode D1. As a result, the voltage is sharply increased in level during the mid portion of the interval T2. The trailing decreasing portion of the interval T2 depends on charge of the source voltage in the capacitor C3.

As the initial closing phase-delayed voltage is maintained, a prelasing phenomenon is prevented from occurring upon oscillating the laser. Moreover, the magnetization curve characteristic of the saturation reactor provides a characteristic of a rapid return of the phase voltage from the opening state to the closing state.

As apparent from the above description, the present invention provides a Q-switching drive circuit utilizing a magnetization curve characteristic of a saturation reactor, thereby capable of achieving a semi permanent use life, a rapid switching into a Q-switching opening phase voltage, a maintenance of the Q-switching opening phase voltage for a period of several hundreds nanoseconds. The Q-switching drive circuit of the present invention can operate at a high repeat rate. The Q-switching drive circuit can be easily and simply manufactured. Since the initial closing phase-delayed voltage is maintained in the Q-switching drive circuit in accordance with the present invention, a prelasing phenomenon is prevented from occurring upon oscillating the laser. Moreover, the present invention can provides a characteristic of a rapid return of the phase voltage from the opening state to the closing state, by virtue of the magnetization curve characteristic of the saturation reactor.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A Q-switching drive circuit for a porro prism laser resonator comprising:

an opening voltage adjusting circuit adapted to adjust an opening voltage applied to a primary coil of a transformer;

a first capacitor adapted to store a voltage predetermined by said opening voltage adjusting circuit and feed it to said primary coil of the transformer, said first capacitor having a capacitance enabling a utilization of the transformer up to a saturated range with respect to the primary coil of the transformer;

said opening voltage adjusting circuit comprising a variable resistor and a resistor both connected to a voltage source terminal in series and having a common junction connected to said first capacitor;

a transformer drive controlling circuit adapted to control driving of the transformer, said transformer drive controlling circuit including a thyristor;

a diode adapted to prevent said thyristor from being damaged due to a counter electromotive force generated from the transformer;

a second resistor adapted to adjust an impedance of a secondary coil of the transformer and thereby reflect a variation in voltage occurring at a pocket cell terminal;

a second capacitor adapted to shut off a closing voltage to be fed to said secondary coil of the transformer; and a closing voltage adjusting circuit adapted to adjust said closing voltage to be stored in said second capacitor.

2. A Q-switching drive circuit in accordance with claim 1, wherein said first capacitor has one terminal thereof coupled to said primary coil of the transformer and the other terminal coupled to ground.

3. A Q-switching drive circuit in accordance with claim 1, wherein said diode is connected in parallel with said primary coil of the transformer.

4. A Q-switching drive circuit in accordance with claim 1, wherein said second resistor is connected in parallel to said secondary coil of the transformer.

5. A Q-switching drive circuit in accordance with claim 1, wherein said second capacitor has one terminal coupled to said secondary coil of the transformer and the other terminal coupled to said pocket cell terminal.

6. A Q-switching drive circuit for a porro prism laser resonator comprising:

an opening voltage adjusting circuit adapted to adjust an opening voltage applied to a primary coil of a transformer;

a first capacitor adapted to store a voltage predetermined by said opening voltage adjusting circuit and feed it to said primary coil of the transformer, said first capacitor having a capacitance enabling a utilization of the transformer up to a saturated range with respect to the primary coil of the transformer;

a transformer drive controlling circuit adapted to control driving of the transformer, said transformer drive controlling circuit including a thyristor connected in series to said primary coil of the transformer, a diode coupled to a gate of the thyristor, and a capacitor coupled to said gate of the thyristor;

a diode adapted to prevent said thyristor from being damaged due to a counter electromotive force generated from the transformer;

a resistor adapted to adjust an impedance of a secondary coil of the transformer and thereby reflect a variation in voltage occurring at a pocket cell terminal;

a second capacitor adapted to shut off a closing voltage to be fed to said secondary coil of the transformer; and a closing voltage adjusting circuit adapted to adjust said closing voltage to be stored in said second capacitor.

7. A Q-switching drive circuit for a porro prism laser resonator comprising:

an opening voltage adjusting circuit adapted to adjust an opening voltage applied to a primary coil of a transformer;

a first capacitor adapted to store a voltage predetermined by said opening voltage adjusting circuit and feed it to said primary coil of the transformer, said first capacitor having a capacitance enabling a utilization of the transformer up to a saturated range with respect to the primary coil of the transformer;

a transformer drive controlling circuit adapted to control driving of the transformer, said transformer drive controlling circuit including a thyristor;

a diode adapted to prevent said thyristor from being damaged due to a counter electromotive force generated from the transformer;

a resistor adapted to adjust an impedance of a secondary coil of the transformer and thereby sufficiently reflect a variation in voltage occurring at a pocket cell terminal;

a second capacitor adapted to shut off a closing voltage to be fed to said secondary coil of the transformer; and a closing voltage adjusting circuit comprising a variable resistor and a resistor both connected to said voltage source terminal in series and having a common junction connected to said second capacitor adapted to adjust said closing voltage to be stored in said second capacitor.

8. A Q-switching drive circuit in accordance with claim 7, wherein said opening voltage adjusting circuit comprises a variable resistor and a resistor both connected to a voltage source terminal in series and having a common junction connected to said first capacitor.

* * * * *